United States Patent
De Lima Filho et al.

(10) Patent No.: US 7,518,352 B2
(45) Date of Patent: Apr. 14, 2009

(54) BOOTSTRAP CLAMPING CIRCUIT FOR DC/DC REGULATORS AND METHOD THEREOF

(75) Inventors: Jader Alves De Lima Filho, Campinas (BR); Richard Titov Lara Saez, Campinas (BR); Wallace Alane Pimenta, Jaguariuna (BR)

(73) Assignee: Freescale Semiconductor, Inc., Austin, TX (US)

( * ) Notice: Subject to any disclaimer, the term of this patent is extended or adjusted under 35 U.S.C. 154(b) by 150 days.

(21) Appl. No.: 11/747,414

(22) Filed: May 11, 2007

(65) Prior Publication Data

US 2008/0278135 A1 Nov. 13, 2008

(51) Int. Cl.
*H02M 3/07* (2006.01)
*G05F 1/575* (2006.01)

(52) U.S. Cl. .............. 323/288; 323/284; 323/285; 327/390; 327/589; 327/541

(58) Field of Classification Search ......... 323/224, 323/265, 266, 282, 284, 285, 288, 351; 327/390, 327/540, 541, 589
See application file for complete search history.

(56) References Cited

U.S. PATENT DOCUMENTS

| 6,037,760 | A | 3/2000 | Borghi et al. |
| 6,489,758 | B2 | 12/2002 | Moriconi et al. |
| 6,714,067 | B1 * | 3/2004 | Farrenkopf ............... 327/589 |
| 6,943,536 | B2 | 9/2005 | Marino et al. |
| 7,026,801 | B2 | 4/2006 | Fowler et al. |
| 2008/0007317 | A1 * | 1/2008 | Bodano et al. ............ 327/390 |
| 2008/0100378 | A1 * | 5/2008 | Bernacchia ............... 327/589 |
| 2008/0218141 | A1 * | 9/2008 | Lu et al. ................... 323/282 |

* cited by examiner

*Primary Examiner*—Gary L Laxton

(57) ABSTRACT

A clamping circuit of a DC/DC regulator includes a reference current generator to generate a reference current. The reference current can be based upon a specified maximum voltage across a bootstrap capacitor of the DC/DC regulator. The clamping circuit also includes a current generator that generates a current based on the voltage across the bootstrap capacitor. The current generated by the current generator is compared to the generated reference current. Based on the comparison, the voltage across the bootstrap capacitor is regulated. By regulating the voltage across the bootstrap capacitor based on current, rather than based directly on the voltage across the capacitor, the design of the clamping circuit is simplified compared to voltage-based implementations.

20 Claims, 4 Drawing Sheets

BOOTSTRAP CLAMPING CIRCUIT FOR DC/DC REGULATORS AND METHOD THEREOF

FIELD OF THE INVENTION

The present disclosure relates to electronic circuits and more particularly to clamping circuits for Direct Current/Direct Current (DC/DC) regulators.

BACKGROUND

Conventional DC/DC regulators employ a bootstrap capacitor to supply power to a driver circuit of the regulator. The charge in the bootstrap capacitor provides a sufficient voltage across the capacitor to supply the driver circuit. However, if the voltage across the capacitor grows too large, this can result in improper or inefficient operation of the driver circuit. For example, if the voltage across the bootstrap capacitor exceeds the maximum gate-source voltage for the transistors of the driver circuit, poor operation of the driver circuit can result. Accordingly, a clamping circuit is employed to regulate the voltage across the bootstrap capacitor.

Some clamping circuits use a voltage comparator to sense the voltage across the bootstrap capacitor, and regulate the voltage based on the sensed voltage. However, the voltage on one of the electrodes of the bootstrap capacitor is typically high (e.g. up to 24 volts). Typical voltage comparators are unable to withstand such high input voltages. While a voltage comparator can be specially designed to accommodate the high input voltages, this can undesirably increase the complexity and cost of the circuit design. Accordingly, there is a need for an improved clamping circuit for DC/DC regulators.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A DC/DC regulator including a clamping circuit is disclosed. The clamping circuit includes a reference current generator to generate a reference current. The reference current can be based upon a specified maximum voltage across a bootstrap capacitor of the DC/DC regulator. The clamping circuit also includes a current generator that generates a current based on the voltage across the bootstrap capacitor. The current generated by the current generator is compared to the generated reference current. Based on the comparison, the voltage across the bootstrap capacitor is regulated. By regulating the voltage across the bootstrap capacitor based on current, rather than based directly on the voltage across the capacitor, the design of the clamping circuit is simplified compared to voltage-based implementations.

Figure 1:
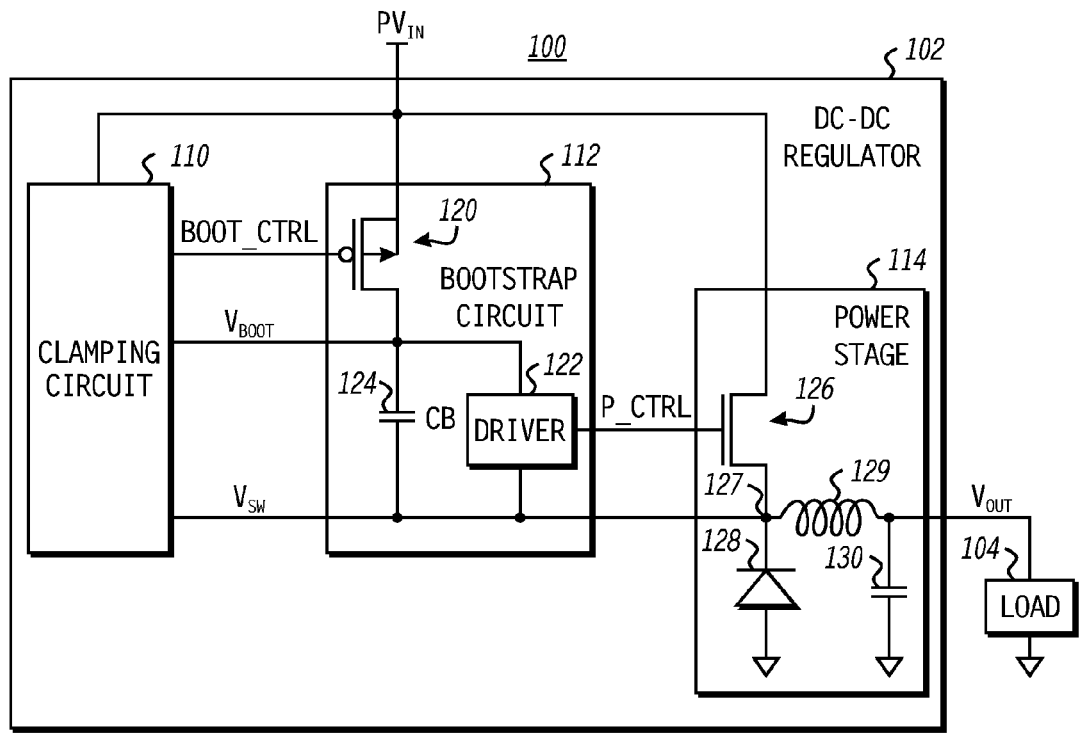
FIG. 1 is a combined block and circuit diagram of particular embodiment of a device 100 employing a DC/DC regulator.

Referring to FIG. 1, a diagram of a device 100 including a DC/DC regulator 102 and a load 104 is illustrated. The DC/DC regulator 102 includes an input to receive an input voltage $PV_{IN}$ and an output to provide a voltage $V_{OUT}$ to the load 104. The DC/DC regulator 102 regulates the voltage $PV_{IN}$ to ensure that the voltage $V_{OUT}$ provided to the load 104 remains within specified limits.

The DC/DC regulator 102 includes a clamping circuit 110, a bootstrap circuit 112, and a power stage 114. The clamping circuit 110 includes an input to receive the voltage $PV_{IN}$, an input to receive a voltage $V_{BOOT}$, an input to receive a voltage $V_{SW}$, and an output to provide a signal BOOT_CTRL. The bootstrap circuit 112 includes an input to receive the signal BOOT_CTRL, an input to receive the voltage $PV_{IN}$, an output to provide the voltage $V_{BOOT}$, an output to provide the voltage $V_{SW}$, and an output to provide the signal P_CTRL. The power stage 114 includes an input to receive the voltage $PV_{IN}$, an input to receive the signal P_CTRL, an input to receive the signal $V_{SW}$ and an output to provide the voltage $V_{OUT}$.

The power stage 114 in the illustrated embodiment includes an n-type transistor 126, a diode 128, an inductor 129, and a capacitor 130. The transistor 126 includes a first current electrode to receive the voltage $PV_{IN}$, a second current electrode connected to a node 127, and a control electrode to receive the signal P_CTRL. The diode 128 includes a terminal connected to the node 127 and a terminal connected to a ground voltage reference. The inductor 129 includes a first terminal connected to the node 127 and a second terminal to provide the voltage $V_{OUT}$. The capacitor 130 includes a terminal connected to the second terminal of the inductor 129 and a terminal connected to the ground reference voltage.

The power stage 114 is configured to provide the voltage $V_{OUT}$ by regulating (i.e. converting) the DC voltage $PV_{IN}$. In particular, the configuration of the inductor 129 and the capacitor 130 convert a voltage applied at the node 127 to the voltage $V_{OUT}$. By selectively applying and negating the application of a voltage at the node 127 over time, the level of the voltage $V_{OUT}$ can be regulated. The signal P_CTRL controls application of the voltage $PV_{IN}$ to the node 127 by controlling the conductivity of the transistor 126. Accordingly, application of the voltage $PV_{IN}$ to the node 127, and therefore the level of the voltage $V_{OUT}$, depends on the duty cycle of the signal P_CTRL.

The bootstrap circuit 112 includes a power switch (p-type transistor 120), a bootstrap capacitor 124, labeled $C_B$, and a driver circuit 122. The transistor 120 includes a first current electrode to receive the voltage $PV_{IN}$, a second current electrode, and a control electrode to receive the signal BOOT_CTRL. The bootstrap capacitor 124 includes a first terminal connected to the second current electrode of the transistor 120 and a second terminal. In a particular embodiment, the capacitance value of the bootstrap capacitor 124 is in the tenths of microfarads. The driver circuit 122 includes a first terminal connected to the first terminal of the bootstrap capacitor 124, a second terminal connected to the second terminal of the bootstrap capacitor 124, and an output to provide the signal P_CTRL.

The driver circuit 122 is configured to control the duty cycle of the signal P_CTRL so that the voltage $V_{OUT}$ remains within specified limits. For example, the driver circuit 122 can receive information about the level of the voltage $V_{OUT}$ via one or more feedback or feedforward paths (not shown) and control the duty cycle of the signal P_CTRL accordingly.

The bootstrap capacitor 124 provides a voltage supply for the driver 122. More specifically, the level of charge in the bootstrap capacitor 124 determines the voltage, called $V_{BC}$, across the bootstrap capacitor 124. The voltage $V_{BC}$ supplies the driver circuit 122. The voltage $V_{BC}$ can be expressed as the difference between the voltage (labeled $V_{BOOT}$) at the first terminal of the bootstrap capacitor 124 and the voltage (labeled $V_{SW}$) at the second terminal.

The signal BOOT_CTRL controls the conductivity of the transistor 120, thereby controlling application of the voltage $PV_{IN}$ to the bootstrap capacitor 124. Accordingly, the signal BOOT_CTRL controls the level of charge in the bootstrap capacitor 124, and therefore controls the level of the voltage $V_{BC}$.

It will be appreciated that the voltage $V_{BC}$ can be controlled within specified limits to ensure efficient function of the driver circuit 122. For example, the voltage $V_{BC}$ should be high enough to ensure proper functioning of the driver circuit 122, but not higher than the maximum specified gate-source voltages for the circuit transistors. In a particular embodiment, the voltage $V_{BC}$ is controlled to be less than 6 volts but greater than 4.5 volts to ensure proper operation of the driver circuit 122.

Accordingly, the clamping circuit 110 controls the signal BOOT_CTRL to ensure that the voltage $V_{BC}$ remains within specified limits. To control the signal BOOT_CTRL, the clamping circuit 110 determines a reference current based on the specified maximum level of the voltage $V_{BC}$ and determines a current based on the voltage $V_{BC}$ itself. The clamping circuit 110 employs a current comparison circuit to compare the two determined currents, and based on the comparison asserts or negates the signal BOOT_CTRL thereby cycling the application of the voltage $PV_{IN}$ to the bootstrap capacitor 124. For example, if the comparison indicates that the current based on the voltage $V_{BC}$ is higher than the reference current (indicating that $V_{BC}$ is outside of specified limits), the clamping circuit 110 asserts the signal BOOT_CTRL to make the transistor 120 substantially non-conductive. Because this negates application of the voltage $PV_{IN}$ to the bootstrap capacitor 124, the charge in the bootstrap capacitor 124 is reduced over time by the driver circuit 124 and therefore the voltage $V_{BC}$ is reduced. Once the voltage $V_{BC}$ is below a specified minimum, the clamping circuit 110 asserts the BOOT_CTRL signal, thereby applying the voltage $PV_{IN}$ to the bootstrap capacitor 124 and ensuring that the voltage $V_{BC}$ does not fall below the specified minimum.

Figure 2:
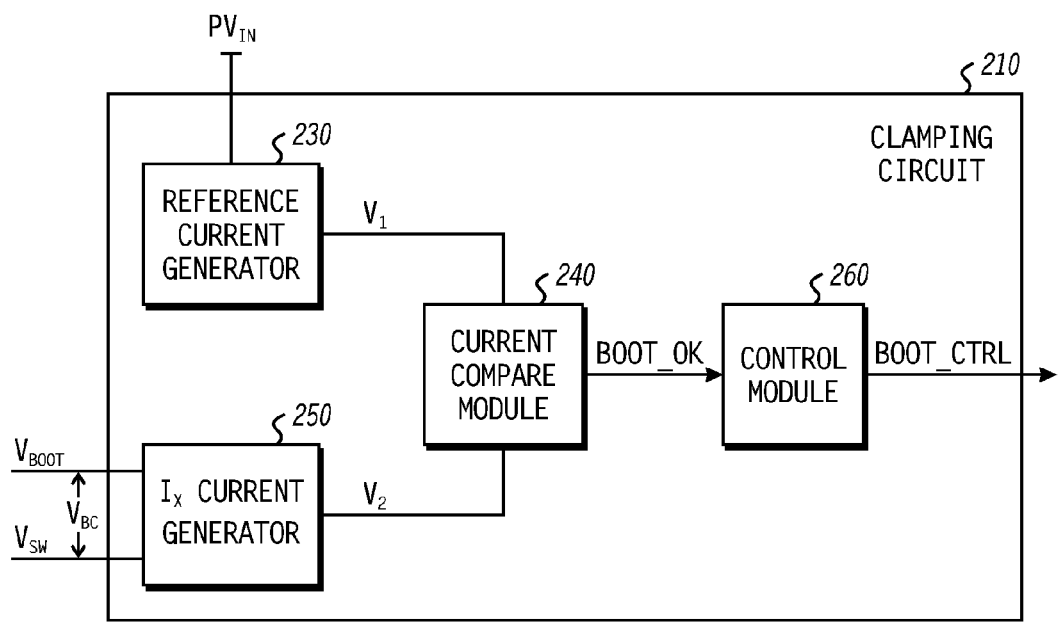
FIG. 2 is a block diagram of a particular embodiment of a clamping circuit of FIG. 1.

Referring to FIG. 2, a block diagram of a particular embodiment of a clamping circuit 210, corresponding to the clamping circuit 110 of FIG. 1, is illustrated. The clamping circuit 210 includes a reference current generator 230, a current ($I_x$) generator 250, a current compare module 240, and a control module 260. The reference current generator 230 includes an input to receive the voltage $PV_{IN}$ and an output to provide a voltage $V_1$. The current generator 250 includes an input to receive the voltage $V_{BOOT}$, a voltage to receive the voltage $V_{SW}$, and an output to provide a voltage $V_2$. The current compare module includes an input to receive the voltage $V_1$, an input to receive the voltage $V_2$, and an output to provide a signal BOOT_OK. The control module 260 includes an input to receive the signal BOOT_OK and an output to provide the signal BOOT_CTRL.

The reference current generator 230 is configured to generate a reference current based upon a maximum specified voltage, and provide the voltage $V_1$ based upon the reference current. The voltage $V_1$ can be used at current mirror transistors in downstream modules to recreate the reference current at those modules.

The current generator 250 is configured to generate a current $I_x$ based upon the voltage $V_{BC}$, which is the difference between the voltage $V_{BOOT}$ and the voltage $V_{SW}$. The current generator 250 is further configured to provide the voltage $V_2$ based upon the generated current $I_x$. The voltage $V_2$ can be used at current mirror transistors in downstream modules to recreate the current $I_x$ at those modules.

The current compare module 240 is configured to generate a current based on the voltage $V_1$ and a current based on the voltage $V_2$ and to compare the two currents. The current compare module 240 is further configured to generate the signal BOOT_OK based upon the comparison of the two generated currents. In a particular embodiment, the current compare module 240 is configured to assert the signal BOOT_OK in response to the current generated based on the voltage $V_2$ being greater than the current generated based on the voltage $V_1$.

The control module 260 is configured to provide the signal BOOT_CTRL based on the signal BOOT_OK. In a particular embodiment, the control module 260 is configured to provide the signal BOOT_CTRL as a representation of the signal BOOT_OK through control circuit 260. In addition, the control module 260 is configured to provide the signal BOOT_CTRL as a well-formed digital signal.

During operation, the reference current generator 230 generates a reference current ($I_{REF}$) based upon a reference voltage. The reference voltage is based upon the specified maximum level of the voltage $V_{BC}$ (i.e. the voltage across the bootstrap capacitor 124). The reference current generator provides the voltage V1 based upon the current $I_{REF}$. In addition, the current generator 250 generates the current $I_x$ based upon the voltage $V_{BC}$ and provides the voltage $V_2$ based upon the generated current.

The current compare module 240 uses a current mirror circuit to generate the reference current $I_{REF}$ based upon the voltage $V_1$ and uses another current mirror circuit to generate the current $I_x$ using the voltage $V_2$. The current compare module 240 compares the generated current and provides the signal BOOT_OK based on the comparison. For example, in response to the current $I_x$ being greater than the reference current, indicating that $V_{BC}$ is greater than the specified maximum voltage, the current compare module 240 negates the signal BOOT_OK. This in turn causes the transistor 120 of the bootstrap circuit 112 to become non-conductive. When the transistor 120 is non-conductive, the driver circuit 122 discharges the bootstrap capacitor 124 over time, thereby reducing the voltage $V_{BC}$.

Once the voltage $V_{BC}$ has fallen below a specified minimum, the current $I_x$ will fall below the reference current generated at the reference current generator 230. In response, the current compare module 240 negates the BOOT_OK signal, thereby causing the transistor 120 to become conductive and restoring application of the voltage $PV_{IN}$ to the bootstrap capacitor 124, thereby increasing the voltage $V_{BC}$. In this way, the clamping circuit 210 controls the conductivity of the transistor 120 to ensure that the voltage $V_{BC}$ remains within specified limits.

Figure 3:
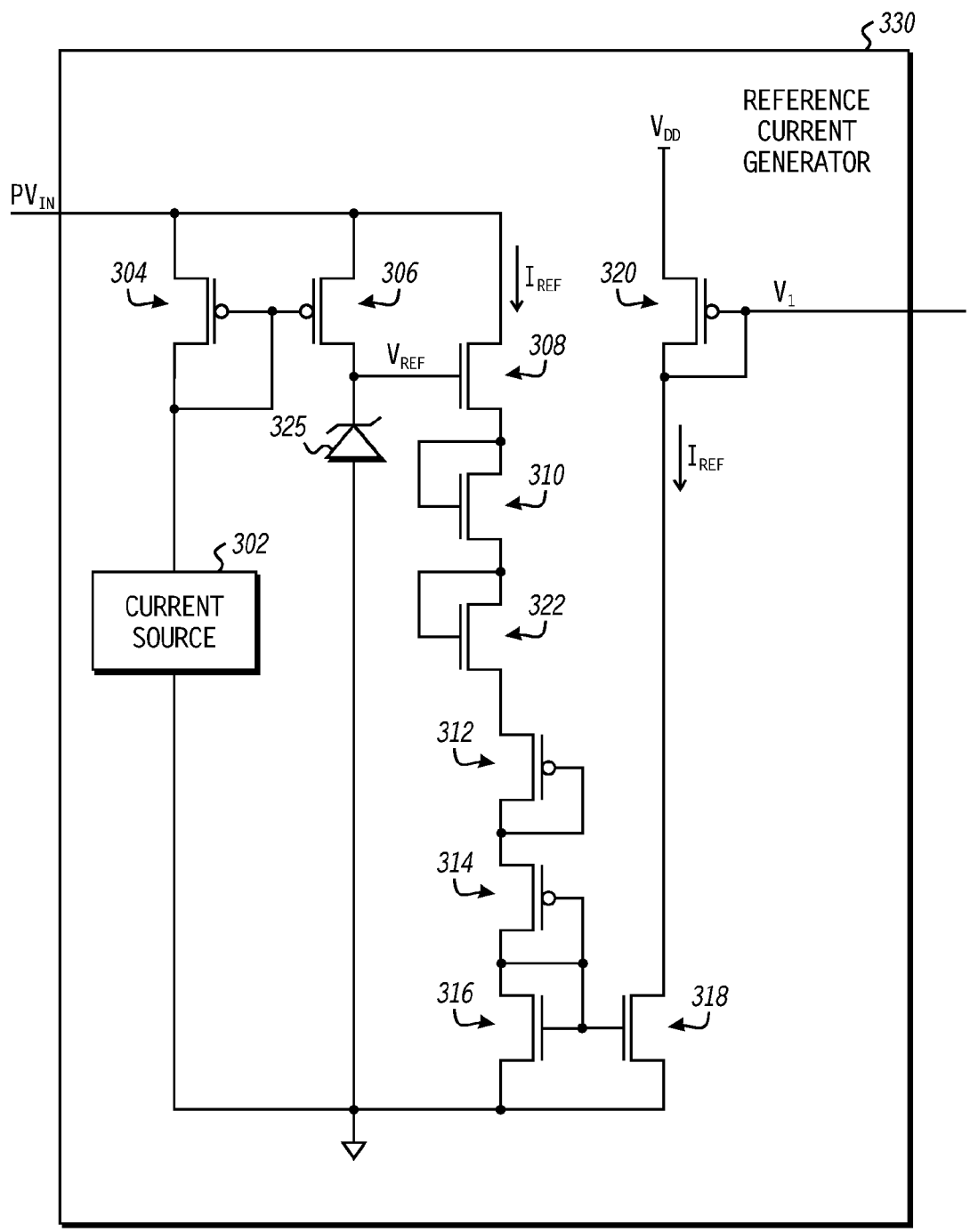
FIG. 3 is a circuit diagram of a particular embodiment of a reference current generator of FIG. 2.

Referring to FIG. 3, a diagram of a particular embodiment of a reference current generator 330, corresponding to the reference current generator 230 of FIG. 2, is illustrated. The reference current generator 330 includes a current source 302, a zener diode 325, p-type transistors 304, 306, 312, 314, and 320, and n-type transistors 308, 310, 322, 316, and 318.

The current source 302 includes a first terminal connected to a ground voltage reference and a second terminal. The transistor 304 includes a first current electrode to receive the voltage $PV_{IN}$, a second current electrode connected to the second terminal of the current source 302, and a control electrode connected to the second current electrode. The transistor 306 includes a first current electrode to receive the voltage $PV_{IN}$, a second current electrode, and a control electrode connected to the control electrode of the transistor 304. The zener diode 325 includes a first terminal connected to the second current electrode of the transistor 306 and a second terminal connected to the ground reference voltage.

The transistor 308 includes a first current electrode to receive the voltage $PV_{IN}$, a second current electrode, and a control electrode connected to the first terminal of the zener diode 325. The transistor 310 includes a first current electrode connected to the second current electrode of the transistor 308, a second current electrode, and a control electrode connected to the first current electrode of the transistor 310. The transistor 322 includes a first current electrode connected to the second current electrode of the transistor 310, a second current electrode, and a control electrode connected to the first current electrode of the transistor 322. The transistor 312 includes a first current electrode connected to the second current electrode of the transistor 322, a second current electrode, and a control electrode connected to the second current electrode. The transistor 314 includes a first current electrode connected to the second current electrode of the transistor 312, a second current electrode, and a control electrode connected to the second current electrode. The transistor 316 includes a first current electrode connected to the second current electrode of the transistor 314, a second current electrode connected to the ground voltage reference, and a control electrode connected to the first current electrode.

The transistor 318 includes a first current electrode, a second current electrode connected to the ground voltage reference, and a control electrode connected to the control electrode of the transistor 316. The transistor 320 includes a first current electrode connected to a voltage reference $V_{DD}$, a second current electrode connected to the first current electrode of the transistor 318, and a control electrode connected to the second current electrode of the transistor 320.

During operation, the configuration of the transistors 304 and 306, as well as the current source 302 and the zener diode 325, provides a relatively stable reference voltage $V_{REF}$. The voltage $V_{REF}$ corresponds to a specified maximum for the voltage $V_{BC}$ across the bootstrap capacitor 124. The voltage $V_{REF}$ depends on the breakdown voltage for the zener diode, which can be set when the zener diode is formed. In addition, the voltage $V_{REF}$ can be changed by connecting additional diodes in series with the zener diode 325, or by replacing the zener diode 325 with one or more diodes connected in series.

The transistors 308, 310, 322, 312, 314, and 316 generate the reference current $I_{REF}$ through the first current electrode of the transistor 308 based on the voltage $V_{REF}$. Thus the reference current $I_{REF}$ is a reference current that represents the specified maximum voltage for $V_{BC}$. The relationship between the current $I_{REF}$ and the voltage $V_{REF}$ can be expressed according to the following formula:

$$V_{REF} = \left(N_{NR} + \frac{1}{\sqrt{A}} N_{PR}\right) \sqrt{\frac{2I_{REF}}{k_n(W/L)_{NR}}} + N_{NR}V_{THNR} + N_{PR}V_{THPR}$$

where $N_{NR}$ is the number of N-type transistors represented by matched devices 308, 310, 322 and 316 (in the illustrated embodiment, $N_{NR}$=4), $N_{PR}$ is the number of P-type transistors represented by matched devices 312 and 314 (in the illustrated embodiment, $N_{PR}$=2), $k_n = \mu_n C_{ox}$ is a process parameter where $\mu_n$ is the electron mobility and $C_{ox}$ is the gate-oxide capacitance per area unit, $(W/L)_{NR}$ is the aspect-ratio of N-type transistors 308, 310, 322 and 316, where W and L are respectively the channel width and length, A is the scaling factor between aspect-ratios of P-type devices 312 and 314 and N-type devices 308, 310, 322 and 316, and multiplied by $k_p/k_n$, $V_{THNR}$ is the threshold voltage of N-type devices 308, 310, 322 and 316 and $V_{THPR}$ is the threshold voltage of P-type devices 312 and 314.

As illustrated, a large number of transistors are connected in series between the voltage $PV_{IN}$ and the ground voltage reference. This allows the reference current generator 330 to generate the current $I_{REF}$ with the relatively high level of $PV_{IN}$ without using transistors with very high voltage compliance.

The transistors 316 and 318 form a current mirror so that the reference current $I_{REF}$ is generated through the first current electrode of the transistor 318. The transistor 320 generates the voltage $V_1$ based on the current $I_{REF}$. Accordingly, the voltage $V_1$ can be provided to transistors of downstream modules that form a current mirror with the transistor 320 so that the current $I_{REF}$ is generated at the downstream modules.

Figure 4:
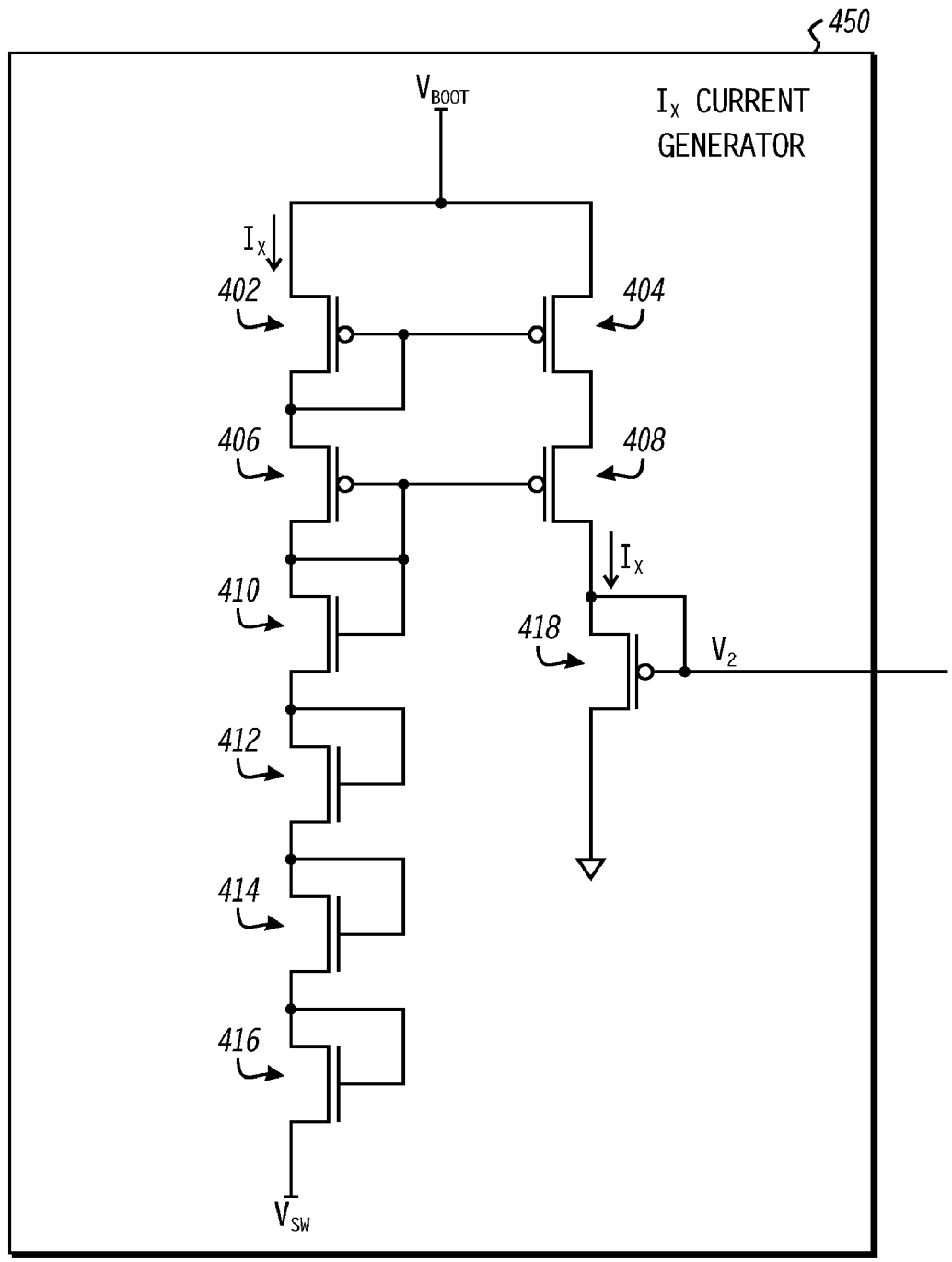
FIG. 4 is a circuit diagram of a particular embodiment of a current generator of FIG. 2.

Referring to FIG. 4, a circuit diagram of a particular embodiment of a current generator 450, corresponding to the current generator 250 of FIG. 2, is illustrated. The current generator 450 includes p-type transistors 402, 404, 406, and 408, as well as n-type transistors 410, 412, 414, 416 and 418. The transistor 402 includes a first current electrode to receive the voltage $V_{BOOT}$, a second current electrode, and a control electrode connected to the second current electrode. The transistor 404 includes a first current electrode to receive the voltage $V_{BOOT}$, a second current electrode, and a control electrode connected to the control electrode of the transistor 402. The transistor 406 includes a first current electrode connected to the second current electrode of the transistor 402, a second current electrode, and a control electrode connected to the second current electrode. The transistor 408 includes a first current electrode connected to the second current electrode of the transistor 404, a second current electrode, and a control electrode connected to the control electrode of the transistor 406.

The transistor 410 includes a first current electrode connected to the second current electrode of the transistor 406, a second current electrode, and a control electrode connected to the first current electrode of the transistor 410. The transistor 412 includes a first current electrode connected to the second current electrode of the transistor 410, a second current electrode, and a control electrode connected to the first current electrode of the transistor 412. The transistor 414 includes a first current electrode connected to the second current electrode of the transistor 412, a second current electrode, and a control electrode connected to the first current electrode of the transistor 414. The transistor 416 includes a first current electrode connected to the second current electrode of the transistor 414, a second current electrode to receive the voltage $V_{SW}$, and a control electrode connected to the first current electrode of the transistor 414. The transistor 418 includes a first current electrode connected to the second current electrode of the transistor 408, a second current electrode connected to a ground voltage reference, and a control electrode connected to the first current electrode of the transistor 418.

During operation, the configuration of the transistors 402, 406, 410, 412, 414, and 416 generates the current $I_x$ based upon the voltage difference between $V_{BOOT}$ and $V_{SW}$. This voltage difference is the voltage $V_{BC}$ across the bootstrap capacitor 124. Thus the current $I_x$ represents the voltage $V_{BC}$. The relationship between the voltage $V_{BC}$ and the current $I_x$ can be expressed according to the following formula:

$$V_{BC} = \left(N_N + N_P \frac{1}{\sqrt{B}}\right)\sqrt{\frac{2I_X}{k_n(W/L)_N}} + N_N V_{THN} + N_P|V_{THP}|$$

where $N_N$ is the number of N-type transistors represented by matched devices 410, 412, 414 and 416 (in the illustrated embodiment, $N_N$=4), $N_P$ is the number of P-type transistors represented by matched devices 402 and 406 (in the illustrated embodiment, $N_P$=2), $k_n = \mu_n C_{ox}$ is a process parameter where $\mu_n$ is the electron mobility and $C_{ox}$ is the gate-oxide capacitance per area unit, $(W/L)_N$ is the aspect-ratio of N-type transistors 410, 412, 414 and 416, where W and L are respectively the channel width and length, B is the scaling factor between aspect-ratios of P-type devices 402 and 406 and N-type devices 410, 412, 414 and 416, and multiplied by $k_p/k_n$, $V_{THN}$ is the threshold voltage of N-type devices 410, 412, 414 and 416, and $V_{THP}$ is the threshold voltage of P-type devices 402 and 406.

Because the voltage $V_{BOOT}$ and $V_{SW}$ are relatively high, a large number of transistors are used to generate the current $I_x$, obviating the need for each of the transistors 402, 406, 410, 412, 414, and 416 to have high voltage compliance.

The transistors 404 and 408 generate the current $I_x$ at the second current electrode of the transistor 408. The current $I_x$ is provided to the first current electrode of the transistor 418. The transistor 418 generates the voltage $V_2$ based on the current $I_x$. Accordingly, the voltage $V_2$ can be provided to transistors of downstream modules that form a current mirror with the transistor 418 so that the current $I_x$ is generated at the downstream modules.

Figure 5:
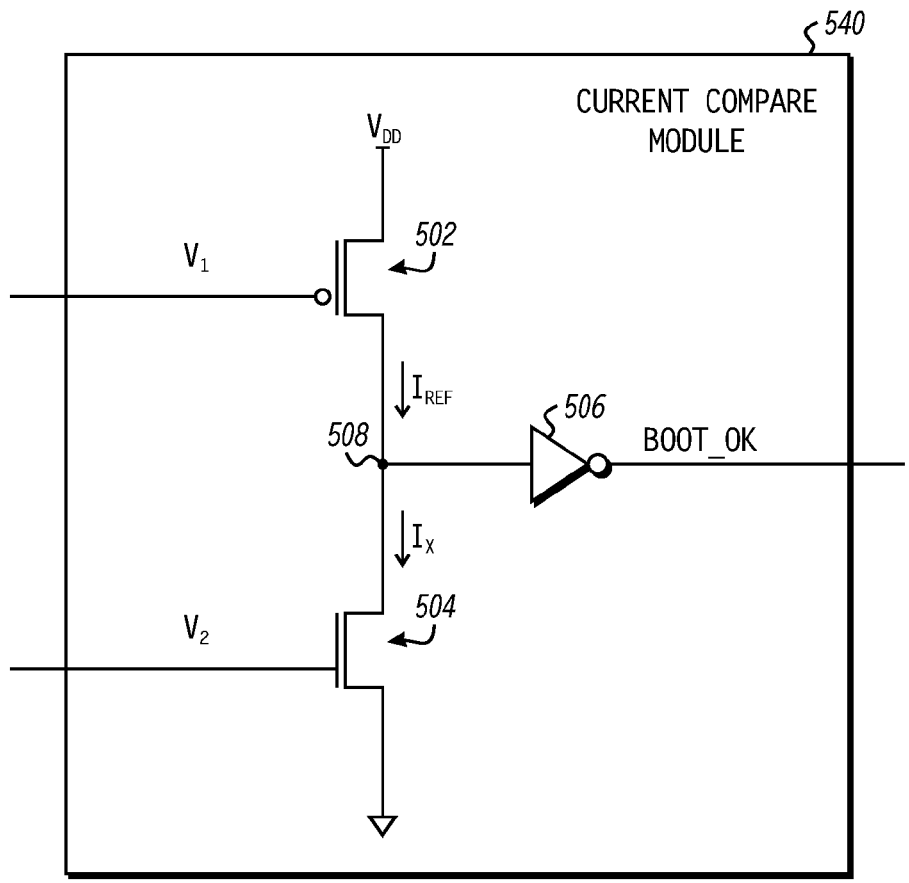
FIG. 5 is a circuit diagram of a particular embodiment of a current comparator of FIG. 2.

Referring to FIG. 5, a circuit diagram of a particular embodiment of a current compare module 540, corresponding to the current compare module 240 of FIG. 2, is illustrated. The current compare module 540 includes a p-type transistor 502, an n-type transistor 504, and an inverter 506. The transistor 502 includes a first current electrode connected to a voltage reference $V_{DD}$, a second current electrode connected to a node 508, and a control electrode to receive the voltage $V_1$. The transistor 504 includes a first current electrode connected to the node 508, a second current electrode connected to a ground voltage reference, and a control electrode to receive the voltage $V_2$. The inverter 506 includes an input connected to the node 508 and an output to provide the signal BOOT_OK.

The transistor 502 forms a current mirror with a transistor of the reference current generator 230 (e.g. the transistor 320 of FIG. 3) so that the reference current $I_{REF}$ is generated through the second current electrode of the transistor 502. The current $I_{REF}$ is based upon a specified maximum voltage across the bootstrap capacitor 124.

The transistor 504 forms a current mirror with a transistor of the current generator 250 (e.g. the transistor 418 of FIG. 4) so that the current $I_x$ is generated through the first current electrode of the transistor 504. The current $I_x$ is based upon the voltage across the bootstrap capacitor 124 ($V_{BC}$).

The voltage at the node 508 is based upon the difference in the current $I_{REF}$ and the current $I_x$. Thus, the voltage at the node 508 represents the difference between the voltage $V_{BC}$ and the specified maximum of that voltage. If the current $I_x$ is greater than the current $I_{REF}$, indicating that the voltage $V_{BC}$ exceeds the specified maximum, the voltage at the node 508 decreases and the transistor 504 leaves its saturation region and enters a triode region, causing the inverter 506 to assert the signal BOOT_OK. This in turn will cause the transistor 120 (FIG. 1) to become non-conductive, preventing any further charging of bootstrap capacitor 124. If the current $I_x$ is lower than the current $I_{REF}$, the voltage at the node 508 increases, causing the transistor 502 to leave its saturation region and enter a triode region, causing the inverter 506 to negate the signal BOOT_OK. This will cause the transistor 120 to become conductive, thereby increasing the voltage $V_{BC}$. Thus, the current compare module 540 provides the signal BOOT_OK based upon the reference current $I_{REF}$ and the current $I_x$ to ensure that the voltage $V_{BC}$ remains within specified limits.

Figure 6:
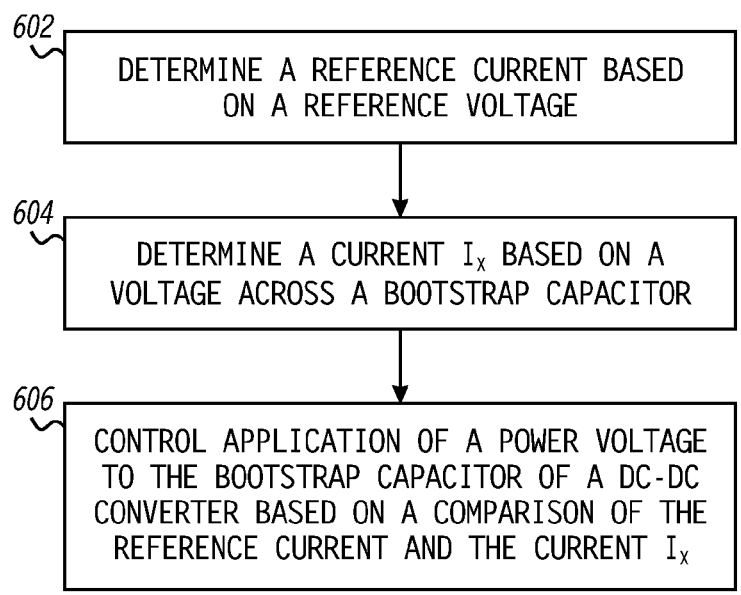
FIG. 6 is a flow diagram of a particular embodiment of a method of regulating the voltage across a bootstrap capacitor of a DC/DC regulator.

Referring to FIG. 6, a flow diagram of a particular embodiment of a method of regulating the voltage across a bootstrap capacitor of a DC/DC regulator is illustrated. At block 602, a reference current $I_{REF}$ is determined based on a reference voltage. In a particular embodiment, the reference voltage $I_{REF}$ is based on a specified maximum voltage for a driver circuit of a DC/DC regulator, which is selected to be less than a maximum gate-source voltage for transistors of a driver circuit of the DC/DC regulator. At block 604, a current $I_x$ is determined based on a voltage across a bootstrap capacitor of the DC/DC regulator. At block 606, application of a power voltage to the bootstrap capacitor is controlled based on a comparison of the reference current and the current $I_x$. The application of the power voltage can be controlled so that the voltage across the bootstrap capacitor remains within specified limits.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the scope of the disclosure. For example, although the embodiments disclosed herein have referred to certain transistors as having a particular polarity, it will be appreciated that transistors of other polarities may also be employed. It will further be appreciated that, although some circuit elements are depicted as connected to other circuit elements, the illustrated elements may also be coupled via additional circuit elements, such as resistors, capacitors, transistors, and the like.

What is claimed is:

1. A device, comprising:
   a power switch comprising a first terminal coupled to an input voltage, a second terminal, and a control terminal;
   a bootstrap capacitor comprising a first terminal coupled to the second terminal of the power switch and a second terminal;
   a driver circuit comprising a first terminal coupled to the second terminal of the power switch, a second terminal coupled to the second terminal of the bootstrap capacitor, and an output terminal;
   a current reference circuit configured to generate a reference current;
   a current generator circuit configured to generate a first current based on a voltage across the bootstrap capacitor; and
   a compare circuit comprising an output coupled to the control terminal of the power switch, the output configured to generate a control signal based on a comparison of the reference current and the first current, the control signal to control the conductivity of the power switch.

2. The device of claim 1, wherein the reference current is based on a reference voltage.

3. The device of claim 2, wherein the reference voltage is based on a specified maximum gate-source voltage of a transistor of the DC-DC converter.

4. The device of claim 2, wherein the current reference circuit comprises:
- a reference voltage circuit comprising an output to provide the reference voltage;
- a first transistor comprising a first current electrode coupled to a first power voltage, a second current electrode, and a control electrode coupled to the output of the reference voltage circuit;
- a second transistor comprising a first current electrode, a second current electrode coupled to a first voltage reference, and a control electrode coupled to the first current electrode;
- a third transistor comprising a first current electrode to provide the reference current, a second current electrode coupled to the first voltage reference, and a control electrode coupled to the control electrode of the second transistor; and
- a set of transistors coupled in series between the second current electrode of the first transistor and the first current electrode of the second transistor.

5. The device of claim 4, wherein the set of transistors comprises a fourth transistor comprising a first current electrode coupled to the second current electrode of the first transistor, a second current electrode, and a control electrode coupled to the first current electrode of the fourth transistor.

6. The device of claim 4, wherein the reference voltage circuit comprises a zener diode comprising a first terminal coupled to the output of the reference voltage circuit and a second terminal coupled to the first voltage reference.

7. The device of claim 6, wherein the reference voltage circuit further comprises a diode coupled in series with the zener diode.

8. The device of claim 4, wherein the current reference circuit further comprises:
- a fourth transistor comprising a first current electrode coupled to the power voltage, a second current electrode, and a control electrode coupled to the second current electrode;
- a fifth transistor comprising a first current electrode coupled to the power voltage, a second current electrode coupled to the output of the reference voltage circuit, and a control electrode coupled to the control electrode of the fourth transistor; and
- a current source comprising a first terminal coupled to the second current electrode of the fourth transistor and a second terminal coupled to the first voltage reference.

9. The device of claim 4, wherein the current reference circuit further comprises a fourth transistor comprising a first current electrode coupled to a second voltage reference, a second current electrode coupled to the first current electrode of the third transistor, and a control electrode coupled to the second current electrode.

10. The device of claim 1, wherein the current reference circuit comprises:
- a first transistor comprising a first current electrode coupled to a first voltage node, a second current electrode, and a control electrode coupled to the second current electrode, a voltage at the first voltage node based on a voltage at a first terminal of the bootstrap capacitor;
- a second transistor comprising a first current electrode coupled to the boot voltage node, a second current electrode, and a control electrode coupled to the control electrode of the first transistor;
- a third transistor comprising a first current electrode coupled to the second current electrode of the first transistor, a second current electrode, and a control electrode coupled to the second current electrode;
- a fourth transistor comprising a first current electrode coupled to the second current electrode of the second transistor, a second current electrode to provide the first current, and a control electrode coupled to the control electrode of the third transistor; and
- a set of transistors coupled in series between the second current electrode of the third transistor and a second voltage node, a voltage at the second voltage node based on a voltage at a second terminal of the bootstrap capacitor.

11. The device of claim 10, wherein the set of transistors comprises a fifth transistor comprising a first current electrode coupled to the second current electrode of the third transistor, a second current electrode coupled to the second voltage node, and a control electrode coupled to the first current electrode.

12. The device of claim 1, wherein the compare circuit comprises:
- a first input to receive a voltage based on the reference current;
- a second input to receive a voltage based on the first current;
- an output node to provide the control signal;
- a first transistor comprising a first current electrode coupled to a first voltage reference, a second current electrode coupled the output node, and a control electrode coupled to the first input; and
- a second transistor comprising a first current electrode coupled to the output node, a second current electrode coupled to a second voltage reference, and a control electrode coupled to the second input.

13. The device of claim 1, further comprising a power stage of the DC-DC comprising an input coupled to the output terminal of the driver circuit and an output to provide a voltage based on the input voltage.

14. A method, comprising:
- determining a reference current based on a reference voltage;
- determining a first current based on a voltage across a bootstrap capacitor; and
- controlling application of a power voltage to the bootstrap capacitor of a DC-DC converter based on a comparison of the reference current and the first current.

15. The method of claim 14, further comprising providing the voltage across the bootstrap capacitor to a driver circuit of the DC-DC converter, the driver circuit to control application of the power voltage to a power stage of the DC-DC converter.

16. The method of claim 14, wherein the reference voltage is based on the voltage across a zener diode.

17. The method of claim 16, wherein the reference voltage is further based on the voltage across a diode coupled in series with the zener diode.

18. The method of claim 14, wherein the reference voltage is based on a specified maximum gate-source voltage of a transistor of the DC-DC converter.

19. The method of claim 14, wherein determining the first current comprises:
- applying a first voltage to a current electrode of a first transistor, the first voltage based on a voltage at a first terminal of the bootstrap capacitor;
- applying a second voltage to a current electrode of a second transistor, the second voltage based on a voltage at a second terminal of the bootstrap capacitor; and
- determining the first current based on a difference between the first voltage and the first current.

20. The method of claim 14, further comprising converting the power voltage to an output voltage.

* * * * *